(12) United States Patent
Geller et al.

(10) Patent No.: US 8,629,453 B2
(45) Date of Patent: Jan. 14, 2014

(54) EXTERNALLY CONFIGURABLE INTEGRATED CIRCUITS

(75) Inventors: Bernard D. Geller, Chapel Hill, NC (US); Peter C. Sears, Anna, TX (US)

(73) Assignee: International Rectifier Corporation, El Segundo, CA (US)

( * ) Notice: Subject to any disclaimer, the term of this patent is extended or adjusted under 35 U.S.C. 154(b) by 412 days.

(21) Appl. No.: 12/110,816

(22) Filed: Apr. 28, 2008

(65) Prior Publication Data

US 2009/0267079 A1 Oct. 29, 2009

(51) Int. Cl.
*H01L 29/15* (2006.01)
(52) U.S. Cl.
USPC .............................. 257/76; 438/106
(58) Field of Classification Search
USPC .............................. 257/76; 438/106
See application file for complete search history.

(56) References Cited

U.S. PATENT DOCUMENTS

| | | | |
|---|---|---|---|
| 6,545,543 B2 * | 4/2003 | Nelson | 330/307 |
| 7,327,006 B2 * | 2/2008 | Svard et al. | 257/459 |
| 2005/0093126 A1 * | 5/2005 | Li | 257/686 |

* cited by examiner

*Primary Examiner* — Shaun Campbell
(74) *Attorney, Agent, or Firm* — Farjami & Farjami LLP

(57) ABSTRACT

A die comprising two or more active electronic components is provided. The active electronic components are capable of being interconnected using interconnections external to the die. The die may be encased within a package, and the active electronic components may be interconnected using interconnections external to the package. By interconnecting the active electronic components, either directly or through one or more additional components, a desired circuit may be formed. In some examples, the desired circuit may be a monolithic microwave integrated circuit (MMIC). Methods of forming the circuit are also disclosed.

20 Claims, 11 Drawing Sheets

EXTERNALLY CONFIGURABLE INTEGRATED CIRCUITS

BACKGROUND

1. Field

The technology described herein relates to the design of circuits, and more particularly to the design of circuits by interconnecting individual components (e.g., gallium nitride material components) which have been pre-fabricated on an integrated circuit.

2. Discussion of Related Art

Modern day circuit designers have two main options for constructing circuits. The first option is to build a circuit from discrete components. As an example, the circuit designer may take various off-the-shelf components, place them on a circuit board, and interconnect them to form the desired circuit. The second option is to build an integrated circuit. Integrated circuits are circuits in which the discrete components are formed on, and integrated with, a substrate, such as a silicon wafer. Each of these options has benefits and drawbacks relative to the other, but neither is perfect in every situation.

The first option (i.e., connecting off-the-shelf discrete components) offers the circuit designer flexibility in choosing where to place, and how to interconnect, the various discrete circuit components to form the desired circuit. However, there are also drawbacks. For example, discrete components can occupy more real estate than is desirable to dedicate to the building of the circuit, for instance because each discrete component is individually packaged. In addition, discrete components are unlikely to be highly identical, even when they are intended to be. This is because discrete components, even when made by a single manufacturer, may differ due to processing variations arising in different batches, on different days, or at different times. Thus, the circuit designer may have great difficulty in designing a circuit which requires highly identical components to achieve desired operating characteristics. Another drawback is the introduction of parasitics which adversely effect the performance of the circuit, especially at higher RF frequencies.

The second option (i.e., forming an integrated circuit) increases the likelihood that components which are meant to be identical will in fact be so, due to the reduced processing variations when making an integrated circuit as compared to when making discrete components. However, integrated circuits offer the end user little or no flexibility in connecting the circuit components because they are interconnected as part of the fabrication process. For example, a customer who purchases an integrated circuit multiplexer cannot rearrange the circuit components to form some other type of circuit. Rather, the circuit will only function as a multiplexer because it is hardwired to do so.

SUMMARY

Individual circuit components formed on a die and configured for external interconnection are provided.

According to one aspect, a device comprising a die is provided. The die comprises a first individual active electronic component, and a second individual active electronic component, wherein the first individual active electronic component and the second individual active electronic component are not electrically interconnected by interconnections on the die. The first individual active electronic component and the second individual active electronic component are configured to be interconnected via external interconnections.

According to another aspect, a device comprising a die is provided. The die comprises a first individual active electronic component, and a second individual active electronic component. The device further comprises an external interconnection to interconnect the first individual active electronic component and the second individual active electronic component.

According to another aspect, a method of fabricating a device is provided. The method comprises forming a die comprising a first active electronic component and a second active electronic component, the first and second active electronic components not interconnected by internal interconnections.

According to another aspect, a method of constructing a monolithic microwave integrated circuit (MMIC) is provided. The method comprises interconnecting, externally to a die, a first individual active electronic component formed in a gallium nitride material on the die and a second individual active electronic component formed in the gallium nitride material on the die to form a MMIC.

According to another aspect, a semiconductor structure is provided. The semiconductor structure comprises a die comprising an individual active electronic component integrated with a passive electronic component. The individual active electronic component and the passive electronic component are configured to be accessed by interconnections external to the die. The individual active electronic component and the passive electronic component are not interconnected to other electronic components on the die.

According to another aspect, a device comprises a die comprising a first active electronic component and a second active electronic component interconnected to the first active electronic component by at least one internal interconnection. The die further comprises a third active electronic component. The third active electronic component is not interconnected to either of the first active electronic component or the second active electronic component by internal interconnections. The third active electronic component is configured to be interconnected to the first and/or second active electronic component via at least one external interconnection.

BRIEF DESCRIPTION OF DRAWINGS

The drawings are provided for purposes of illustration only, and do not limit the various aspects of the invention. Also, it will be understood that some or all of the drawings are not to scale.

DETAILED DESCRIPTION

Figure 1A:
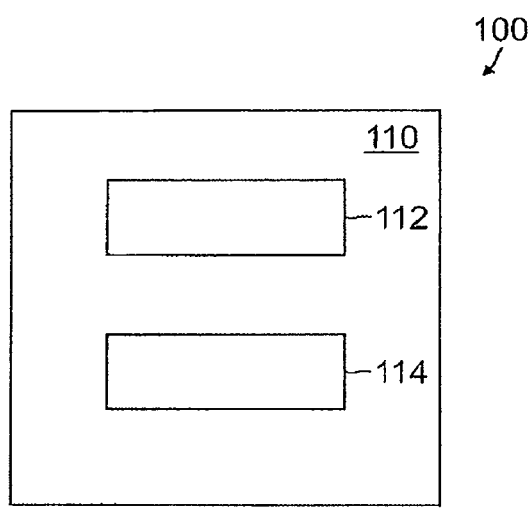
FIG. 1A is a non-limiting example of a die comprising two active electronic components which are not interconnected by interconnections on the die.

According to an aspect of the invention, individual electronic components are manufactured on a die, but are not interconnected on the die. The individual electronic components can be interconnected via interconnections external to the die, such as by wire bonding. Therefore, a circuit designer or customer may choose how to interconnect the individual electronic components, either to each other or to other circuit components, to form a desired circuit. In this application, the term "die" refers to a substrate plus any layers, structures, or components formed on, in, or partially in the substrate.

Because the individual electronic components are formed on a single die, and may be in close proximity to each other, the occurrence and degree of processing variations present in fabricating the individual components may be reduced. Accordingly, the individual electronic components may be highly identical if so designed. Furthermore, the individual electronic components can be formed in any material, such as a semiconductor material, a III-V material, a III-nitride material, a gallium nitride material, a gallium arsenide material, or any other suitable type of material. Also, the individual active electronic components can be interconnected by external interconnections to form a monolithic microwave integrated circuit (MMIC), or any other type of circuit. In one implementation, the die is encased within a package, and the individual electronic components are interconnected by interconnections external to the package. As used herein, the term "encased," refers to a partial or complete surround of the item encased (e.g., a die).

MMICs may include at least one semiconductor device and, typically, other circuit elements arranged to perform a desired electrical function. MMICs typically may be capable of operating, or performing their desired electrical function, at high frequencies, such as microwave frequencies. The term "monolithic" means that the semiconductor device and the additional circuit elements of the MMIC may be formed on, and/or in the bulk of, the substrate.

Multiple aspects of the invention are described below. These aspects may be used individually, all together, or in any combination of two or more.

According to an aspect of the invention, a device comprises a die comprising a first active electronic component and a second active electronic component. The first and second active electronic components are not interconnected by interconnections on the die, but are capable of being interconnected by interconnections external to the die. As used herein, interconnections which are "external" to a die are those that are not formed on, or in, the die. As described further below, examples of external interconnections include wire bonding and flip-chipping. By contrast, internal interconnections are those formed directly on, or internal to, a die (e.g., metallization layers, etc.) Internal interconnections may often be formed during the fabrication process of the active electronic components themselves, e.g., a metal layer formed during semiconductor fabrication of the active electronic components.

FIG. 1A shows a block diagram representation of a device 100 comprising a die 110 on which active electronic components 112 and 114 are formed. The die 110 may comprise a substrate on which a semiconductor material (e.g., a gallium nitride material) is formed. For example, the substrate may be a silicon substrate, or any other substrate, as the aspect of the invention directed to a device comprising a die comprising two individual active electronic components is not limited in this respect. The gallium nitride material may be formed on, and may overlay, the entire substrate, or only a portion thereof. The gallium nitride material may be patterned into one or more regions on top of the substrate. For example, the gallium nitride material may be grown on the substrate, and then etched to form two or more rectangular regions of gallium nitride material separated by a region of the substrate material. However, it will be appreciated that the aspect of the invention directed to a device comprising a die comprising two individual active electronic components is not limited in this respect. Furthermore, while a gallium nitride material is one example of a material that may be formed on the substrate, other materials may alternatively be used, such as GaAs, or any other suitable material.

In this application, when a structure (e.g., layer, region) is referred to as being "on", "over", or "overlying" another structure, it can be directly on the structure, or an intervening structure (e.g., layer, region) also may be present. A structure that is "directly on" or "in contact with" another structure means that no intervening structure is present. It should also be understood that when a structure is referred to as being "on," "over," "overlying," or "in contact with" another structure, it may cover the entire structure or a portion of the structure.

The active electronic components 112 and 114 may be formed, at least in part, in the semiconductor material (e.g., a gallium nitride material). The active electronic components may be any type of active electronic component, such as transistors or diodes, amongst other examples. Furthermore, the device may include any suitable number of active electronic components (e.g., two or more). It will be appreciated that "active electronic component" as used herein includes any electronic component to which a voltage or current is applied to activate, i.e., induce a change in the state of, the component (e.g., transistors, diodes, etc.), whether configured to operate as an active component or a passive component, but excludes passive electronic components like resistors, capacitors, and inductors.

Furthermore, the relative spacing between the active electronic components may take any suitable value. For example, the active electronic components may be separated on a surface of the die 110 by approximately 3 mm, 300 microns, less than 300 microns, or any other suitable value. In one implementation, the active electronic components may be formed in close proximity (e.g., 3 mm or less) to reduce the occurrence and degree of processing variations during the fabrication of the active electronic components.

As shown in FIG. 1A, active electronic component 112 and active electronic component 114 are not interconnected by internal interconnections. For example, in the non-limiting example of FIG. 1A, there are no metal traces or other wiring directly on the die which interconnect the two active electronic components. However, as will be described in greater detail below, the active electronic components 112 and 114 may be interconnected by interconnections external to the die 110. For example, wire bonding or flip-chipping may be used to interconnect the active electronic components 112 and 114. As used herein, the phrase "flip-chipping" refers to the mounting of a die to a mounting apparatus (e.g., a circuit board) using solder bumps, typically, but not always, placed on contact pads of the die. The die may then be flipped over (i.e., the active side of the die faces the mounting apparatus) and mounted to the mounting apparatus using the solder bumps. Moreover, the various aspects of the invention are not limited to structures having no internal interconnections of active electronic components, but may include one or more internal interconnections between active electronic components, with the active electronic components still being configured to be further interconnected by one or more external interconnections.

In addition, the die 110 may be encased within a package (e.g., a pin grid array package). However, a package is optional and is therefore not shown in FIG. 1A.

Figure 1B:
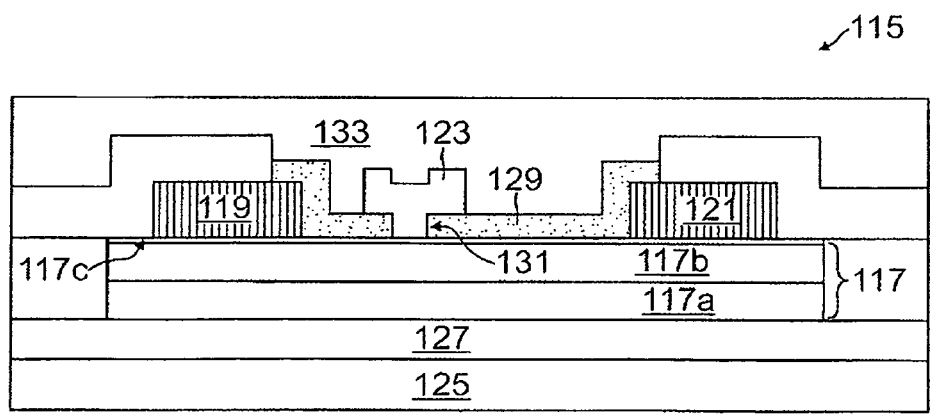
FIG. 1B is an exemplary transistor which may serve as an active electronic component in a device of the type illustrated in FIG. 1A.

FIG. 1B illustrate a cross-section of a transistor 115 which can serve as an active electronic component, such as the active electronic component 112 in FIG. 1A. It should be understood that the transistor 115 is described as an example only, and that the active electronic components 112 and 114 are not limited to the type of component shown in FIG. 1B, or to the configuration or construction of the transistor 115 in FIG. 1B. Transistor 115 includes a gallium nitride material region 117 comprising multiple layers 117a, 117b, and 117c. The transistor 115 also includes a source electrode 119, a drain electrode 121 and a gate electrode 123 formed on the gallium nitride material region 117. The gallium nitride material region is formed on a substrate 125 and, as shown, a transition layer 127 may be formed between the substrate 125 and the gallium nitride material region 117. The transistor 115 includes a passivating layer 129 that protects and passivates the surface of the gallium nitride material region 117. A via 131 is formed within the passivating layer 129 in which the gate electrode is in part formed. An encapsulation layer 133 is formed over the gate electrode and passivation layer, amongst other features.

Figure 2:
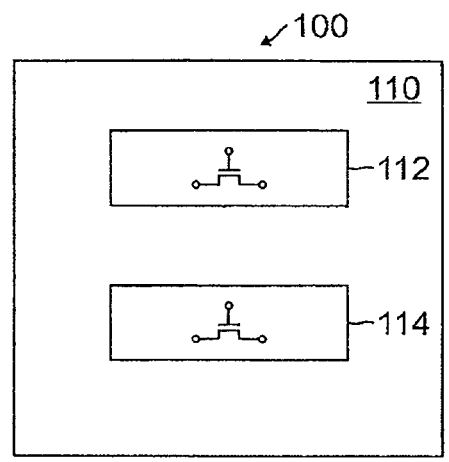
FIG. 2 illustrates one exemplary implementation of the device 100 from FIG. 1A, in which the active electronic components are transistors.

FIG. 2 illustrates one non-limiting implementation of the device 100 in FIG. 1A. In FIG. 2, the device 100 comprises the die 110, on which the active electronic components 112 and 114 are formed. In this implementation, the active electronic components 112 and 114 are transistors, and more specifically are field effect transistors (FETs). However, this aspect of the invention is not limited in this respect, as other types of active electronic components can be used. For example, the active electronic components 112 and 114 may be diodes, or any other suitable active electronic component. Furthermore, the active electronic components 112 and 114 need not be the same type of component. For example, active electronic component 112 may be a transistor while active electronic component 114 may be a diode. Other combinations of active electronic components are also possible.

Figure 3A:
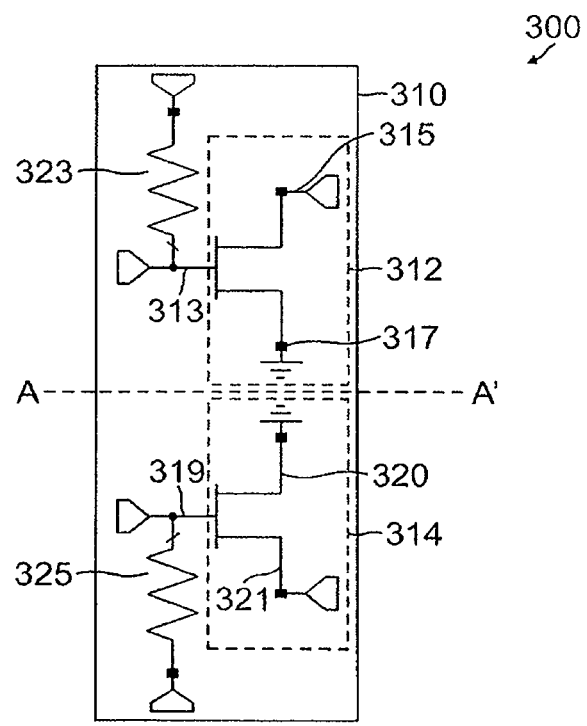
FIG. 3A is a circuit schematic of a device comprising two active electronic components, each integrated with a respective passive electronic component, according to one embodiment.

As mentioned, the active electronic components 112 and 114 shown in FIG. 1A may be implemented in any of a variety of ways. FIG. 3A illustrates a circuit schematic of one possible implementation of the device 100 from FIG. 1A. As shown, the device 300 comprises a die 310, on which a first active electronic component 312 and a second active electronic component 314 are formed. In the non-limiting example of FIG. 3A, the first active electronic component 312 is a first FET, while the second active electronic component 314 is a second FET. The first FET comprises a gate terminal 313, a drain terminal 315, and a source terminal 317, which in the non-limiting example of FIG. 3A is grounded. Similarly, the second FET comprises a gate terminal 319, a drain terminal 321, and a source terminal 320, which in the non-limiting example of FIG. 3A is grounded. It will again be appreciated that the first and second FETs are not interconnected by any interconnection on the die 310. However, they are configured in a manner which allows for external interconnection of the components. The potential to be externally interconnected can be identified by the presence of suitable structures providing external electrical access to the electronic components on the die, such as contact pads or other suitable structures.

FIG. 3A also illustrates that the structure 300 may comprise one or more passive electronic components integrated with each active electronic component. In the non-limiting example of FIG. 3A, the device 300 comprises a gate bias resistor 323 integrated with the first FET, and configured to enable control of the voltage of the gate terminal 313 of the first FET. Similarly, a second passive electronic component, in the form of gate bias resistor 325, is integrated with the gate terminal 319 of the second FET, and configured to enable control of the voltage of the gate terminal 319 of the second FET. It will be appreciated that the illustrated integration of a FET with a gate bias resistor is non-limiting, as other types of passive electronic components may be integrated with the active electronic components, or other configurations may be employed. Furthermore, as has been mentioned, the inclusion of passive electronic components in the device 300 is optional, as the active electronic components 312 and 314 may, in some implementations, be the only electronic components on the die 310.

According to another aspect of the invention, the electronic components are configured in a mirror configuration. For example, as shown in FIG. 3A, the first FET and the second FET are arranged approximately symmetrically with respect to line A-A'. Similarly, gate bias resistors 323 and 325 are arranged in a mirror configuration, i.e., symmetrically about the line A-A'. The mirror configuration may facilitate access to the electronic components, for example by facilitating suitable placement of contact pads for the electronic components. However, the aspect of the invention directed to a device comprising a die comprising two individual active electronic components is not limited in this respect, as other configurations are also possible.

As mentioned, the general structure illustrated in FIG. 1A may be implemented in various ways. One manner in which the structure may be implemented is by using active electronic components 112 and 114 that are both the same type of components, as well as being approximately the same size. It will be appreciated that the size of the components may be related to one or more operating characteristics of the components (e.g., power capability, frequency response, etc.), and may be chosen accordingly.

Figure 3B:
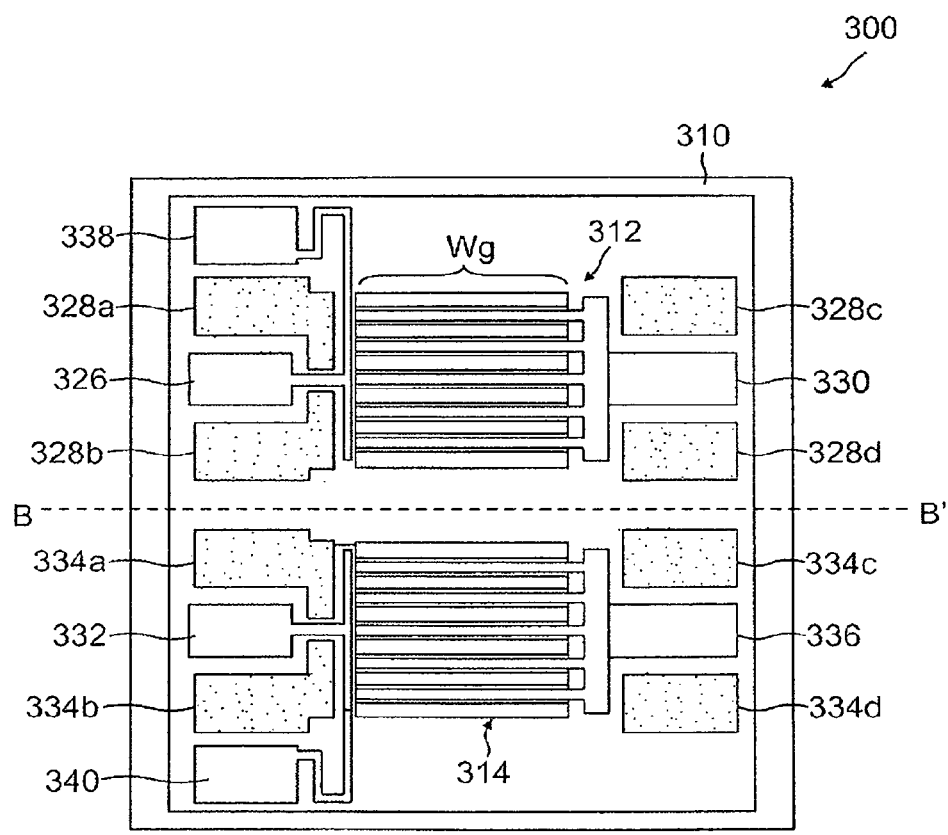
FIG. 3B illustrates one exemplary physical implementation of the device 300 from FIG. 3A.

FIG. 3B illustrates one non-limiting physical implementation of the circuit schematic illustrated in FIG. 3A comprising equally sized active electronic components. As shown, the structure 300 comprises the die 310 comprising a first FET 312 integrated with a gate bias resistor, and a second FET 314 integrated with a gate bias resistor. The first FET 312 comprises multiple repeating source and drain regions, and a total of ten gate fingers (shown and explained in greater detail below with reference to FIG. 3C), access to which is provided by the pads shown: the gate fingers are accessed by gate pad 326; the source regions are accessed by source pads 328a-328d; and the drain regions are accessed by drain pad 330.

Each gate finger of FET 312 has a gate width $W_g$ within the range of 50-500 microns, and in some implementations a value of approximately 200 microns. Accordingly, the first FET 312 has a total gate width of approximately 0.5 to 5.0 mm, and in some implementations a value of approximately 2 millimeters, which may relate to the power capability of the FET. For example, a larger FET may be capable of handling larger powers than a FET having a smaller total gate width. Similarly, the second FET 314 has ten gate fingers, each having a width in the range of 50 to 500 microns, and in some implementations a value of approximately 200 microns. Accordingly, the second FET 314 may have a total gate width ranging from 0.5 to 5 mm, or any other value, and in some implementations a value of approximately 2 millimeters.

Similar to the first FET 312, the second FET 314 comprises repeating source and drain regions and ten gate fingers. Access to the gate fingers is provided by gate pad 332. Access to the source regions is provided by source pads 334a-334d. The drain regions of the second FET 314 are accessed by drain pad 336.

Again, FIG. 3B illustrates one non-limiting implementation in which the device 300 comprises an integrated passive electronic component with each active electronic component. The first FET 312 is integrated with a gate bias resistor which is accessed by a pad 338. Similarly, the second FET 314 is integrated with a gate bias resistor which is accessed by pad 340. It will be appreciated that the aspect of the invention directed to a device comprising a die comprising two individual active electronic components is not limited in this respect, as either one, or both, of the first and second FETs need not be integrated with a passive electronic component.

Similar to FIG. 3A, it should be appreciated in FIG. 3B that the electronic components are arranged in a mirror configuration about line B-B'. In other words, the first FET and its integrated gate bias resistor are arranged symmetrically about the line B-B' with respect to the second FET and its gate bias resistor. However, the arrangement of the electronic components in a mirror configuration is non-limiting, as other configurations are also possible.

Figure 3C:
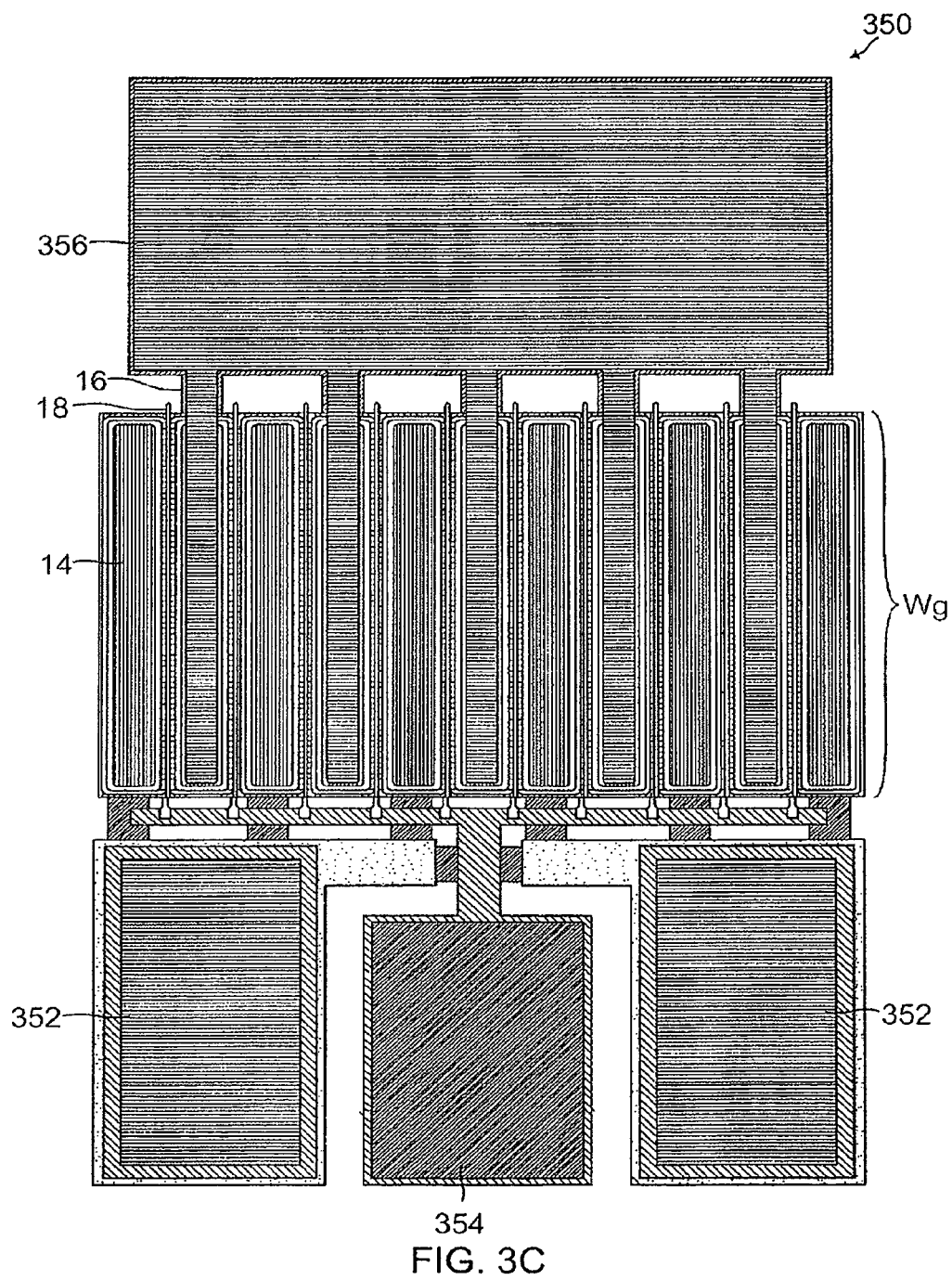
FIG. 3C illustrates one exemplary physical implementation of a transistor which may serve as an active electronic component in the device 300 of FIGS. 3A and 3B.

While FIG. 3B illustrates one physical implementation of a FET (e.g., FET 312) which may serve as the active electronic component in a device according to aspects of the invention, it will be appreciated that other physical implementations are possible, and the active electronic components are not limited to any particular physical implementation. FIG. 3C shows in greater detail an alternate physical implementation of a FET, similar to the FETs shown in FIG. 3B, which may serve as an active electronic component according to aspects of the invention. It will be appreciated that other physical implementations are possible.

The transistor 350 includes ten transistor building block structures. The transistor building block structures include source electrodes 14, drain electrodes 16, and gate electrodes 18 (also called gate fingers). As shown, the source electrodes 14 are connected to a common source pad 352; the gate electrodes 18 are connected to a common gate pad 354; and, the drain electrodes 16 are connected to a common drain pad 356. In the illustrative transistor 350, ten gate electrodes are connected to the gate pad, six source electrodes are connected to the source pad, and five drain electrodes are connected to the drain pad. It should be understood that the transistor 350 is provided as an example, and other implementations of a transistor are possible. For example, the transistor may include a different number of building block structures and/or have different types of electrode and pad connections.

As mentioned, the active electronic components used in aspects of the invention may have any size. The size of the active electronic components may be chosen based on desired operating characteristics of the components (e.g., power capability) or based on any other reason. In the non-limiting implementation of FIG. 3C, each gate electrode has a width $W_g$ in the range of approximately 50 microns to 500 microns, and in some implementations approximately 200 microns. Accordingly, the transistor 350 may be a 0.5 to 5 mm device, or have any other size, and in some implementations may be a 2 millimeter device, in that the total gate width of the ten gate electrodes may be equal to approximately 2 millimeters. It will be appreciated that any other suitably-sized active electronic component may be used, as the active electronic components are not limited in this respect.

Figure 3D:
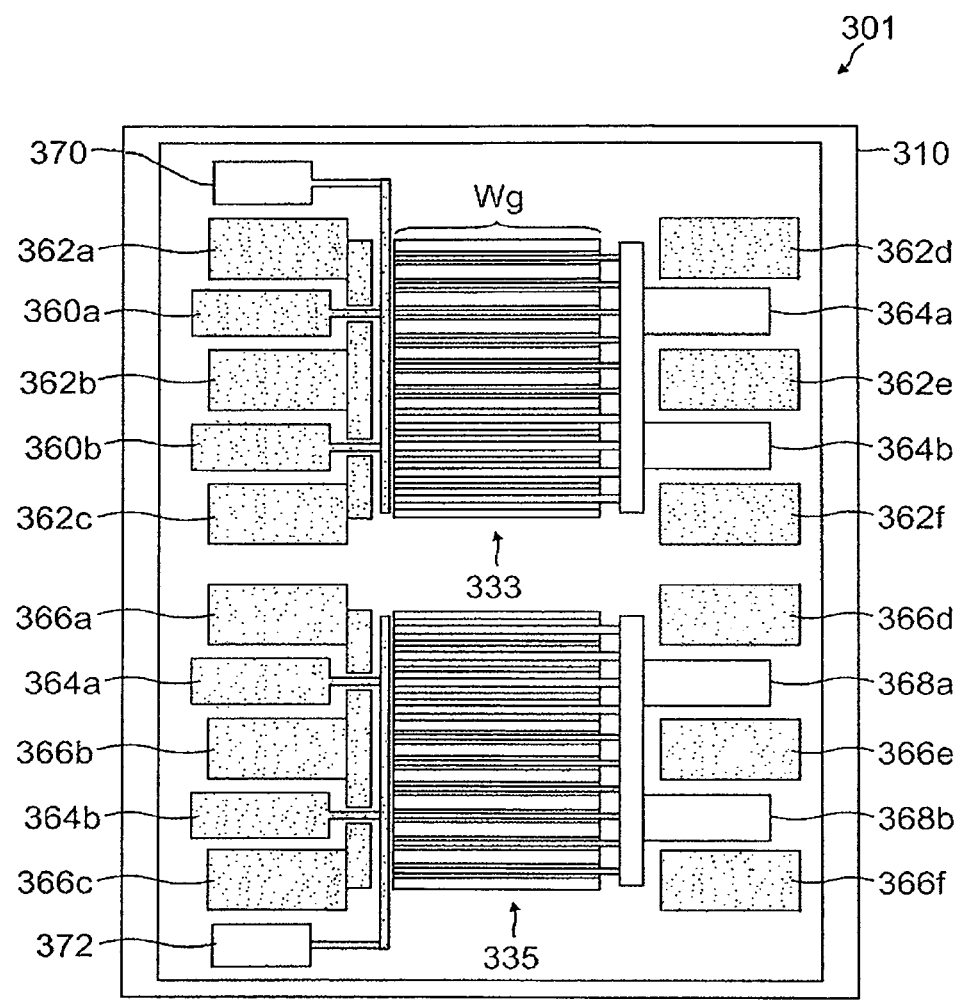
FIG. 3D illustrates an alternative physical implementation of the device 300 from FIG. 3A.

While FIG. 3B illustrates one non-limiting physical implementation of the circuit schematic illustrated in FIG. 3A using active electronic components of the same type and approximately equal size, it will be appreciated that other physical implementations are possible. For example, as opposed to the 2 millimeter FETs illustrated in FIG. 3B, two 4 millimeter FETs may be used to implement the circuit schematic, as shown in FIG. 3D. As shown, the structure 301 comprises two 4 millimeter FETs (as measured by the total gate width of each FET) 333 and 335, each integrated with a gate bias resistor. The FETs in FIG. 3D are larger than the FETs in FIG. 3B in terms of total gate width, and include additional gate, source, and drain electrodes compared to the FETs of FIG. 3B. In FIG. 3D, each FET includes 20 gate electrodes, with each gate electrode having a width $W_g$ in the range from approximately 50 microns to 500 microns, and in some implementations approximately 200 microns, therefore giving each FET a total gate width of approximately 1 to 10 mm, and in some implementations 4 millimeters. External access to the electronic components of the device is provided by various pads: the gate electrodes of the first FET 333 are accessed by gate pads 360a and 360b; the source electrodes of the first FET 333 are accessed by source pads 362a-362f; the drain electrodes of the first FET 333 are accessed by drain pads 364a and 364b; the gate electrodes of FET 335 are accessed by gate pads 364a and 364b; the source electrodes of FET 335 are accessed by source pads 366a-366f; and the drain electrodes of FET 335 are accessed by drain pads 368a and 368b.

As further shown in the non-limiting implementation of FIG. 3D, each FET is integrated with a gate bias resistor. The gate bias resistor integrated with the first FET 333 is accessed via pad 370. The gate bias resistor integrated with the second FET 335 is accessed via pad 372. It will be appreciated that other physical implementations are possible, as the device is not limited to any particular physical implementation.

As has been mentioned, an aspect of the invention is directed to a die comprising individual active electronic components which are not interconnected by internal interconnections, but which may be interconnected by one or more interconnections external to the die. The external interconnections may be formed by wire bonding, flip-chipping, or any suitable means. The active electronic components may be connected directly to each other by connections external to the die, or may be interconnected through one or more additional active or passive components. It will be appreciated that other implementations are also possible. Moreover, some aspects of the invention are not limited to structures having no internal interconnections of active electronic components, but may include one or more internal interconnections between active electronic components, with the active electronic components still being configured to be further interconnected by one or more external interconnections.

For example, two individual transistors may be formed on a die and have their gates interconnected by an internal interconnection, while the other terminals (i.e., the sources and drains) of the transistors may be configured to be externally interconnected. In this non-limiting scenario, the internal interconnection between the gates of the transistors may be the only internal interconnection between the transistors. All other interconnections (if any) between the transistors may be external interconnections. It should be appreciated that this is one non-limiting example, and other configurations of interconnections are possible.

Figure 4:
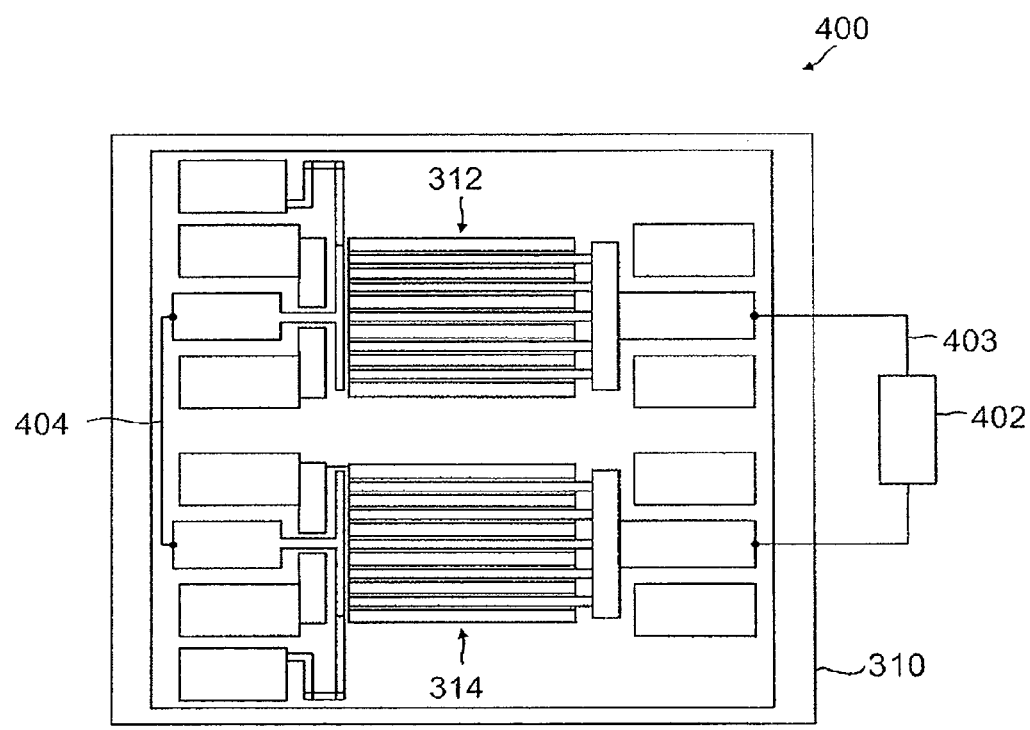
FIG. 4 illustrates the device 300 from FIG. 3B with various external interconnections.

FIG. 4 illustrates the device 300 of FIG. 3B with various external interconnections. For purposes of simplicity, some of the reference numbers from FIG. 3B are not repeated in FIG. 4. The first interconnection 403 interconnects the drain pads of the first FET 312 and the second FET 314. The interconnection is not direct, as element 402 is connected between the drain pads of the first FET 312 and the second FET 314, but the drains pads are still electrically interconnected. The interconnection 403 may be any type of external interconnection, such as a wire bond, or any other suitable interconnection. The element 402 may be any suitable type of component. For example, the element 402 may be a passive or an active electronic component, such as a resistor, a capacitor, an inductor, a transistor, a diode, or any other type of electronic component.

In the non-limiting implementation of FIG. 4, a second interconnection 404 interconnects the gate pads of the first FET 312 and the second FET 314. As with interconnection 403, interconnection 404 may be a wire bond, or any other suitable external interconnection.

The two illustrated external interconnections are merely examples of possible interconnections. It will be appreciated that these two interconnections may be present at the same time, alone, or in any combination, as the devices described herein are not limited to any particular number (including zero) or arrangement of external interconnections. Moreover, any pad of the first FET may be connected to any pad of the second FET, either directly or via one or more elements (e.g., element 402) to form a desired circuit, as the aspect of the invention directed to a device comprising a die comprising two individual active electronic components with external interconnections is not limited to interconnection of any particular pads of the active electronic components. Additionally, the first active electronic component and the second active electronic component may be interconnected by first interconnecting one of the active electronic components to a circuit board on which the die 310 may be mounted, and then interconnecting the second active electronic component to the circuit board. Other implementations are also possible.

It will be appreciated that various types of circuits may be formed by suitable interconnection of the active electronic components illustrated in FIG. 4. The various aspects of this invention are not limited to any particular resulting circuit. The resulting circuit may depend on the nature, or type, of the active electronic components, as well as any passive electronic components which may be also integrated on the die, as well as the specific placement of the external interconnections. For example, appropriate interconnection of active electronic components such as those illustrated in FIG. 4 may allow formation of single-ended amplifiers, Doherty amplifiers, push-pull amplifiers, balanced amplifiers, switch-mode amplifiers, power-combined amplifiers, or any other type of circuit, as the invention is not limited in this respect. According to one implementation, the active electronic component may be interconnected to form a MMIC. The MMIC may be any type of MMIC and be constructed to perform any desired function(s).

As described, the active electronic components on a die may be interconnected (either directly or through one or more additional components) via external interconnections. It will also be appreciated that the individual active electronic components on a die may be used individually, i.e., without any interconnection relationship to other active electronic components on the die. For example, the active electronic component 312 illustrated in FIG. 4 may be coupled to circuitry off the die 310, none of which may be interconnected with the active electronic component 314. Thus, according to one aspect of the invention, a device comprises a die comprising two or more individual active electronic components that may be used as part of separate circuits.

The interconnections illustrated in FIG. 4 are external to the die 310, in that they are not formed on, or in, the die, for example by formation of a metal trace on the die during fabrication of the die. Rather, the interconnections 403 and 404 may be formed after the die 310 has been completed, and may be formed by any appropriate structure, such as by wire bonding, flip-chipping, or any other suitable structure. A user may choose the manner in which to interconnect the components on the die 310, or the interconnection may be done by machine, as the aspect of the invention relating to external interconnection of active electronic components on a die is not limited in this respect. Furthermore, the external interconnections may be formed at the time die 310 is fabricated, or at a later time, as the aspect of the invention relating to external interconnection of active electronic components on a die is not limited to any temporal relationship between formation of the die and formation of the external interconnections.

As has been described, one implementation of the aspect of the invention directed to a die comprising two active electronic components which are not interconnected by interconnections on the die uses two active electronic components of the same type and approximately equal size. However, other implementations are possible, as this aspect of the invention is not limited to any particular implementation. For example, an alternative implementation may include two active electronic components of the same type but differing sizes.

Figure 5A:
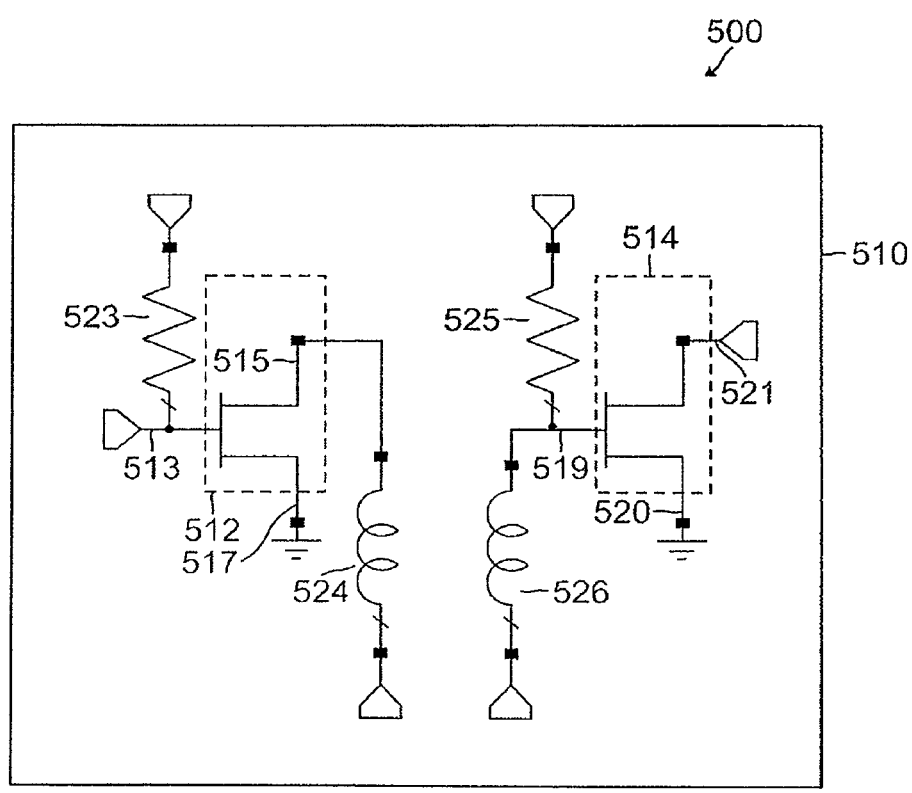
FIG. 5A is a circuit schematic of an alternative device 500 comprising two active electronic components, each integrated with two passive electronic components, according to one embodiment.

FIG. 5A illustrates one non-limiting example of a circuit, in schematic form, which may be formed according to an aspect of the invention. The device 500 comprises a die 510, on which a first active electronic component 512 and a second active electronic component 514 are formed. In the non-limiting, exemplary implementation of FIG. 5A, the first active electronic component 512 comprises a first FET, having a gate terminal 513, a drain terminal 515, and a source terminal 517. Similarly, the second active electronic component 514 comprises a second FET having a gate terminal 519, a drain terminal 521, and a source terminal 520. The first active electronic component 512 and the second active electronic component 514 may be formed in any suitable material, such as a semiconductor material, a III-V material, a III-nitride material, a gallium nitride material, a gallium arsenide (GaAs) material, or any other suitable type of material, as the type of material is not limiting. The type of material may be selected in dependence on its electrical properties (e.g., power dissipation), or in dependence on any other considerations.

The device 500 further comprises two passive electronic components integrated with each active electronic component. However, it will be appreciated that this implementation is non-limiting, as the passive electronic components may be omitted. As illustrated, active electronic component 512 is integrated with a gate bias resistor 523. Similarly, active electronic component 514 is integrated with a gate bias resistor 525. In addition, each active electronic component is integrated with a respective inductor. Active electronic component 512 is integrated with inductor 524, which is connected to the drain terminal 515. Likewise, active electronic component 514 is integrated with inductor 526, which is connected to the gate terminal 519. It will be appreciated that the circuit schematic of FIG. 5A is merely one non-limiting example, as other arrangements of individual electronic components may be formed.

Figure 5B:
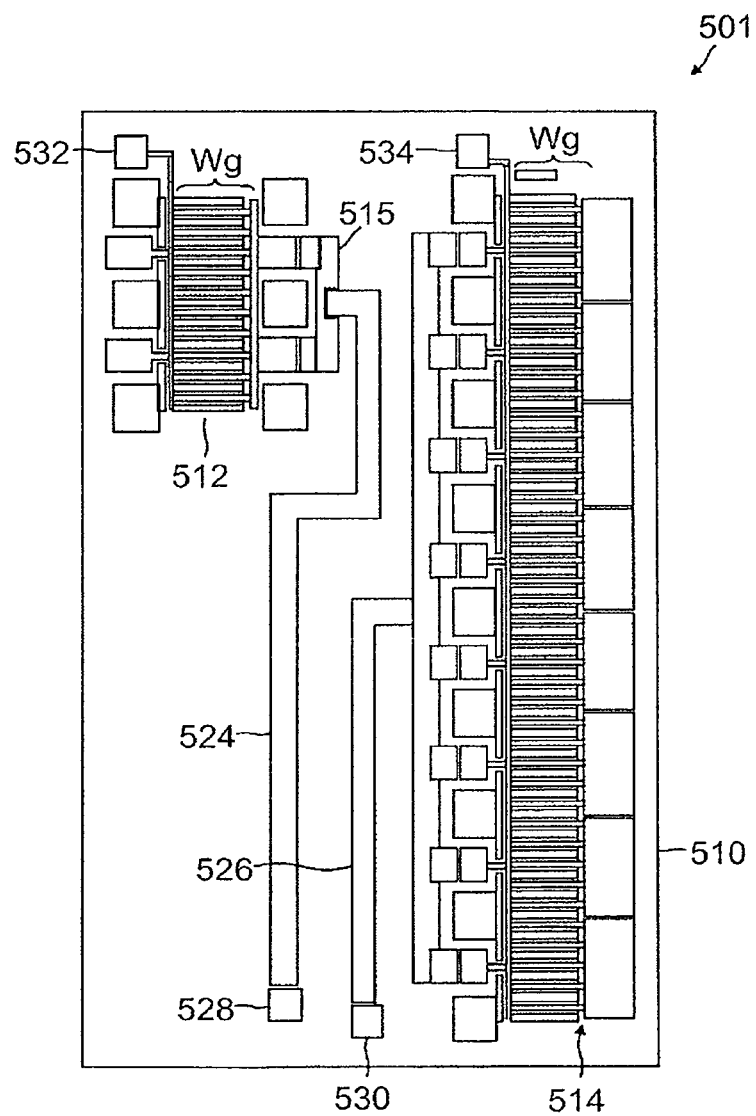
FIG. 5B illustrates one exemplary physical implementation of the device 500 from FIG. 5A.

In one physical implementation of the circuit schematic of FIG. 5A, the active electronic components 512 and 514 are the same type of electronic component, and have approximately the same size. In an alternative implementation, as illustrated in FIG. 5B, the active electronic components 512 and 514 are physically implemented using electronic components of the same type, but differing sizes. The size of each component may be designed, or selected, based on any suitable criteria, such as desired operating characteristics of the component. For example, the size of each component may relate to the power capability of the component, and different components may be selected to have different sizes to provide differing power capabilities.

As shown in FIG. 5B, the device 501 comprises a first FET corresponding to active electronic component 512, disposed on the left side of the die 510. The first FET is a multi-gate FET comprising a total of 20 gate electrodes, each having a gate width $W_g$ in the range from approximately 50 microns to 500 microns, and in some implementations approximately 200 microns. Therefore, the first FET 512 may be a 1 to 10 mm FET, and in some implementations is a 4 millimeter FET, as measured by the total gate width of the FET. The active electronic component 514 is physically implemented as a second FET, having 80 gate electrodes, each in the range of approximately 50 microns to 500 microns in width, and in some implementations 200 microns in width. Therefore, in some implementations the second FET has a total gate width of approximately 16 millimeters. Therefore, the sizes of the first FET and second FET may be related by any suitable ratio (e.g., 3 to 1; 4 to 1; 5 to 1, or any other suitable ratio), and the particular ratio for a given implementation may relate to the relative power capabilities of the first and second FETs.

As illustrated, the first FET 512 and the second FET 514 are not interconnected by any interconnections on the die 512. However, they are capable of being interconnected by interconnections external to the die, in a manner similar to that described above with regard to FIG. 4. For example, the pads 528, 530, 532, and 534 may provide external access to the components on die 510 so that they can be externally connected to each other and/or to other components.

As shown, inductor 524, which may be a metal trace or any other type of structure serving as an inductor, is integrated with the first FET 512 and connected to the drain pad 515 of the first FET 512. Similarly, inductor 526 is integrated with the second FET, and connected to the gate pads of the second FET. As with inductor 524, inductor 526 may be formed by a metal trace, or any other suitable structure, as the passive electronic components described herein are not limited to any particular physical implementation. The inductors 524 and 526 may be accessed by respective pads 528 and 530. The values of the inductors illustrated in FIG. 5B may be selected, or designed, in dependence on the size of the respective FETs. However, the passive electronic components are not limited to any particular values, or methods of selecting their values.

As illustrated, a gate bias resistor is integrated with each of the FETs in device 501. The gate bias resistors are accessible via pads 532 and 534, respectively. The values of the gate bias resistors may be selected, or designed in dependence on the size of the respective FETs. However, this aspect of the invention is not limited to any particular value for the gate bias resistors.

In the non-limiting implementation of FIG. 5B, it will be appreciated that the electronic components may be arranged in any suitable configuration. While the first FET 512 and second FET 514 are illustrated as being on opposing sides of the die 510, other configurations are possible. For example, the first FET 512 and the second FET 514 may be arranged approximately linearly, i.e., having their gate electrodes aligned. The specific configuration chosen for the circuit components may be chosen in dependence on various factors, such as available die area, ease of accessibility to the contact pads of the electronic component, or any other consideration.

Figure 5C:
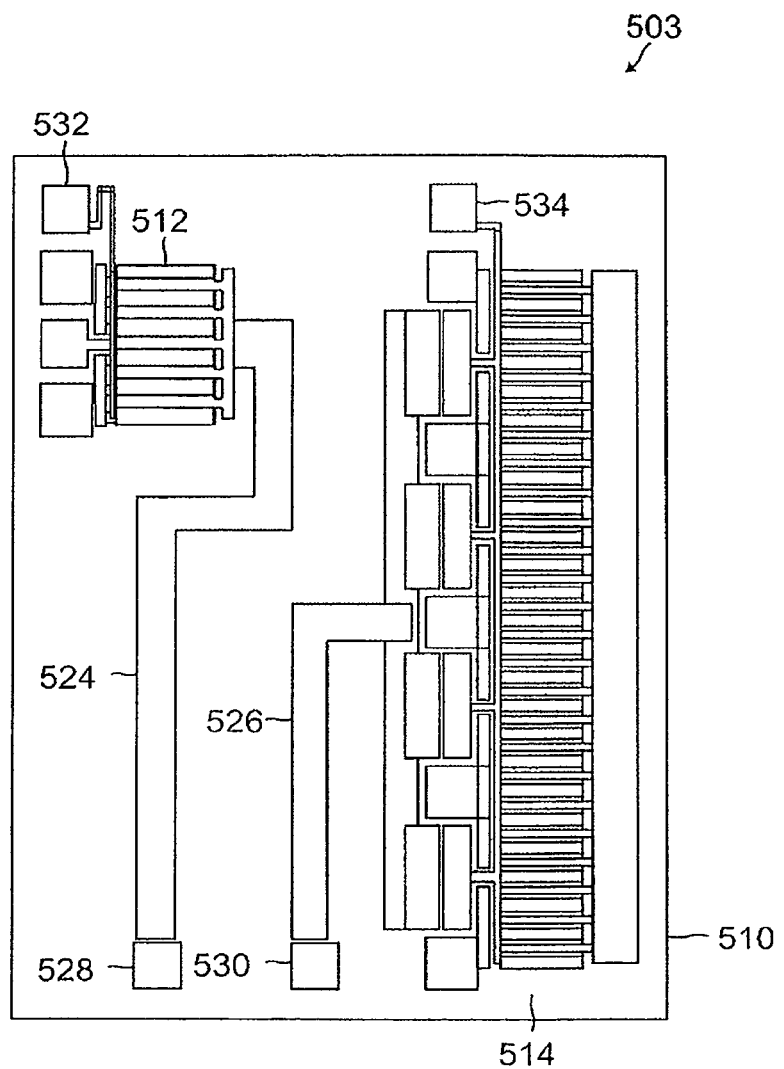
FIG. 5C illustrates an alternative physical implementation of the device 500 from FIG. 5A.

FIG. 5C illustrates an alternative implementation of the device 500. In FIG. 5C, the device 503 comprises an active electronic component 512 implemented as a 2 millimeter FET and an active electronic component 514 implemented as an 8 millimeter FET, as measured by the total gate widths of the FETs. Accordingly, the integrated resistors and inductors may have values different values from those which may be used in FIG. 5B, to accommodate the different sizes of the FETs in FIG. 5C. It will be appreciated that other implementations are possible.

The electronic components illustrated in FIGS. 5B and 5C may be interconnected in any manner to form a completed circuit. For example, in FIG. 5B, the first FET 512 may be interconnected with the second FET 514 by external interconnections to form a two-stage amplifier, a push-pull amplifier, a Doherty amplifier, a balanced amplifier, a switch-mode amplifier, a power-combined amplifier, or any other type of circuit. Other circuits may also be formed by suitable interconnection of the components illustrated in FIGS. 5B and 5C, as the aspect of the invention directed to formation of a circuit by external interconnection of active electronic components on a die is not limited to any particular interconnection of the components, or any particular resulting circuit. In one implementation, the individual components illustrated in FIGS. 5A-5C may be connected (either directly or through one or more additional components) to form a MMIC. For example, the individual components may be of a suitable type, size, and configuration to facilitate their placement within a MMIC. The MMIC may be any type of MMIC, and may perform any function, as the specific type of circuit formed is non-limiting.

According to an aspect of the invention, a die comprising two or more individual active electronic components which are not interconnected by interconnections on the die may be encased within a package. As previously mentioned, the term "encased" does not require a complete surround, but may include a partial surround. For example, a package may be said to encase a die in the situation in which there are access points (e.g., pins) providing access to the die external to the package. The two or more active electronic components may be interconnected by interconnections external to the package, such as by wire bonding, or any other suitable external interconnection. This aspect of the invention is not limited to any particular type of packaging, or any particular external interconnection structure(s). The electronic components may be directly interconnected, interconnected via one or more additional components, or used in isolation.

Devices formed according to any of the aspects of the invention described herein may be encased within a package (e.g., device 100, device 300, device 301, etc.). The package may be any type of package, as the aspect of the invention relating to packaged devices comprising a die comprising a plurality of individual active electronic components is not limited in this respect. For example, the particular package for a given device may depend on the type and/or configuration of a die which it encases. For example, the package may be a ball grid array (BGA) package, a pin grid array package, a quad flat package no leads (QFN), or any other suitable package. The package may include external access points for accessing the device it encases. The type and configuration of the access points may depend on the type of package, as for example a pin grid array may have one type of access point (i.e., pins) while a BGA may have a different type of access point.

Figure 6A:
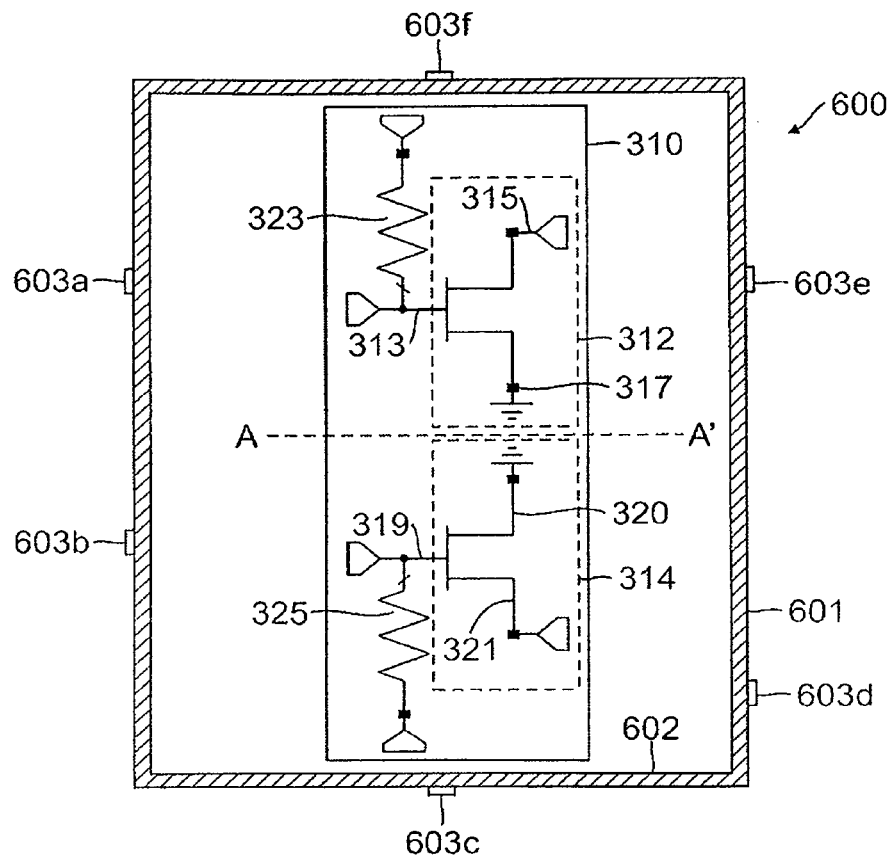
FIG. 6A illustrates a device including a die encased within a package, according to one embodiment.

FIG. 6A illustrates one non-limiting example of a device 600 comprising a package 601 encasing a die (illustrated as die 310 from FIG. 3A) comprising two active electronic components (shown as active electronic components 312 and 314). It will be appreciated that other dies could be encased within the package 601, as die 310 is one non-limiting example. The package 601 has an inner surface 602 defining the space within which die 310 is encased, and includes several access points, illustrated as access points 603a-603f. These access points may be pins, for example if the package 601 is a pin grid array type package, or any other suitable type of access point. Six access points are illustrated because there are six pads on die 310 to which access may be desired (i.e., the gate pads of the first and second FETs, the pads for accessing the first and second gate bias resistors 323 and 325, and the pads for accessing the drain terminals of the first and second FETs). There are no access points needed for the source terminals of the first and second FETs in this non-limiting example because the source terminals are grounded. It will be appreciated that the number of access points may increase or decrease depending on the electronic components on the die, and how many pads there are for accessing those electronic components. In the illustrated example, there is one access point for each pad on the die 310. However, it will be appreciated that the illustrated 1-to-1 ratio of access points to pads is non-limiting, as the number of access points and pads need not be equal.

Figure 6B:
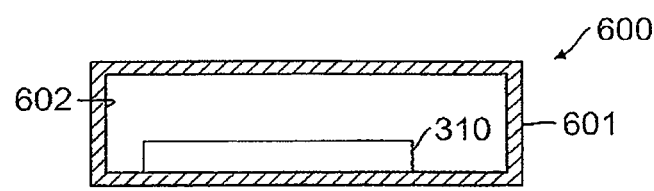
FIG. 6B is a cross section of FIG. 6A.

FIG. 6B illustrates a cross-section view of structure 600 from FIG. 6A. In this view, it can be appreciated that the die 310 is encased within the package 601 in a space defined by the inner surface 602 of the package. The die 310 may be mounted to the package 601 in any suitable manner, as the aspect of the invention relating to packaged devices comprising a die comprising a plurality of individual active electronic components is not limited in this respect. For example, the type of mounting may depend on the type of package 601.

Figure 7A:
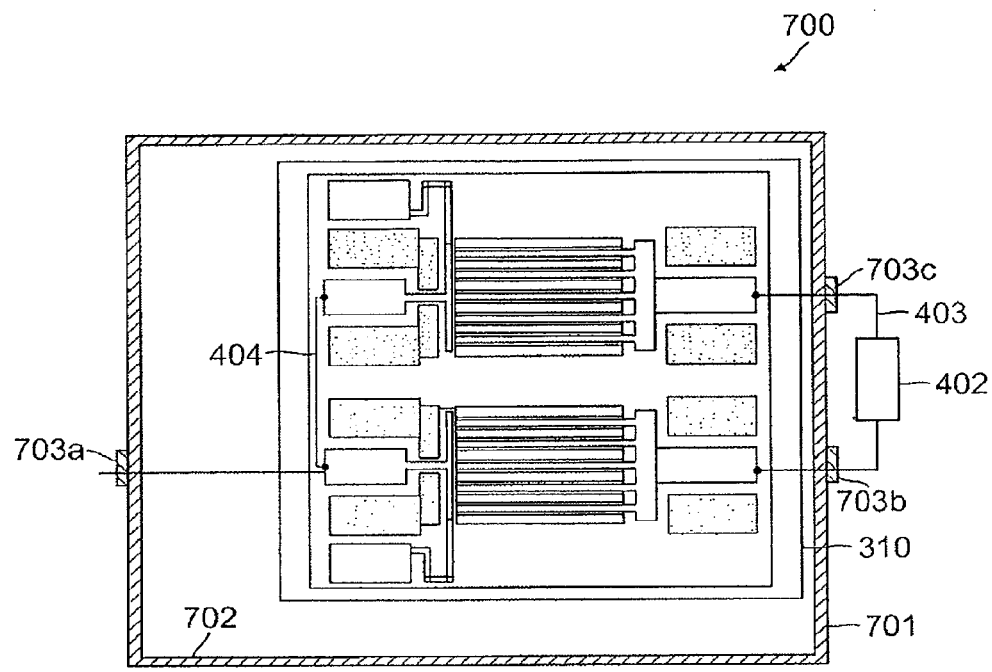
FIG. 7A illustrates the structure 400 of FIG. 4 with the addition of a package.

When a die, such as die 310, is encased within a package, such as package 601, the active electronic components on the die may be interconnected via external interconnections within, or external to, the package. FIG. 7A illustrates a device 700 similar to device 400 from FIG. 4, with the addition of a package 701 having an inner surface 702. As with FIG. 4, FIG. 7A shows two external interconnections: interconnection 403; and interconnection 404. As shown, interconnection 403 is located physically outside, or external to, the package 701. Access to the die 310 is provided by access points 703a, 703b, and 703c. Only three access points are illustrated for simplicity, but it will be appreciated that any number of access points may be provided, and the number, configuration, and type of access points may depend on the type of package as well as the electronic components on the die encased within the package, or any other considerations. Interconnection 404 is implemented internal to the package 701, but is still an external interconnection in the sense that it may be formed by wire bonding, flip-chipping, or some other manner of interconnection not involving an interconnection integrated on the die 310.

Figure 7B:
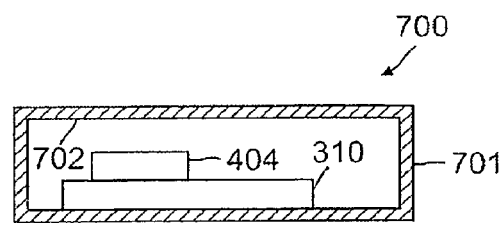
FIG. 7B is a cross section of part of the structure 700 of FIG. 7A.

FIG. 7B is a partial cross-section of FIG. 7A illustrating one exemplary implementation of the interconnection 404. FIG. 7B excludes items in FIG. 7A which are external to the package 701. As shown, the die 310 is encased within inner surface 702 of package 701. The die 310 may be mounted within package 701 in any suitable manner, as the type and positioning of the mounting is not limiting. The interconnection 404 interconnects the gate pads of the first FET and the second FET, as illustrated in FIG. 7A. As shown in FIG. 7B, interconnection 404 is external to the die 310, in that it is formed in a manner so as not to be integrated on die 310. For example, interconnection 404 may be formed by wire bonding. In this sense, interconnection 404 is an external interconnection, even though it is physically located within package 701. It will be appreciated that other physical implementations of interconnection 404 are possible.

One aspect of the invention is directed to a die comprising a individual passive electronic component integrated with a individual active electronic component. The passive electronic component and active electronic component may be unconnected from other components by interconnections on the die, however may be capable of being connected to other components on or off the die via external interconnections. The passive electronic component may be any type of passive electronic component, such as a resistor, a capacitor, an inductor, or any other passive electronic component. Similarly, the active electronic component may be any type of active electronic component, such as a transistor, a diode, or any other type of active electronic component. In one implementation, the passive and/or active electronic components are formed in a gallium nitride material. However, other materials may be used, as the passive and active electronic components are not limited to implementation in any particular material.

FIGS. 3A and 3B illustrate the basic concept. As previously described in connection with FIG. 3A, an active electronic component (i.e., active electronic component 312) may be integrated with a passive electronic component (i.e., gate bias resistor 323). As shown, the active electronic component and the passive electronic component are not interconnected to other components on the die 310 by interconnections on the die (i.e., internal interconnections). However, the gate bias resistor 323 and the FET 312 are capable of being interconnected to other electronic components by interconnections external to the die, such as by wire bonding or other external interconnections.

It will be appreciated that FIG. 3A is one non-limiting example of a die comprising an active electronic component integrated with a passive electronic component. Other implementations are possible, as, for example, the active electronic component may be an active electronic component other than a transistor, and the passive electronic component may be any type of passive electronic component. Furthermore, the active electronic component and the passive electronic component may be formed in any type of material, and are not limited to implementation in any particular material. For example, while the active electronic component and the passive electronic component may be formed in a gallium nitride material, they may alternatively be formed in a GaAs material, any III-V material, III-nitride material, or any other suitable material. Furthermore, the active electronic component and the passive electronic component need not be formed of the same type of material.

As has been described with respect to other aspects of the invention, the device according to the present aspect of the invention may be connected externally to one or more additional components to form any type of circuit, for example by connecting external interconnections to contact pads contacting the active electronic component 312 and/or the gate bias resistor 323. For example, the active electronic component 312 and the gate bias resistor 323 may be connected via external connections to additional electronic components to form an amplifier, or any other type of circuit. In one implementation, the active electronic component 312 and the gate bias resistor 323 are connected via external connections to additional electronic components to form a MMIC.

The integration of a passive electronic component (e.g., gate bias resistor 323) with an active electronic component (e.g., active electronic component 312) may reduce the amount of real estate needed to implement the two circuit components, as compared to if each component was implemented as a separate, discrete component. Furthermore, integrating the passive electronic component with the active electronic component may reduce undesirable operating characteristics, such as parasitics or other effects which may result if the passive electronic component and active electronic component are implemented as separate, discrete components.

The structures illustrated thus far may be made in any suitable manner, as the various aspects of the invention are not limited to any particular method of manufacture. For example, conventional semiconductor processing techniques may be used. Other methods are also possible.

Having thus described several aspects of the invention, it is to be appreciated various alterations, modifications, and improvements will readily occur to those skilled in the art. For example, as has been mentioned, aspects of the invention may provide a die comprising three or more individual active electronic components (e.g., three transistors, two transistors and a diode, two diodes and a transistor, etc.). In some implementations, two of the three or more individual active electronic components may be interconnected by internal interconnections, with at least one of the individual active electronic components not interconnected to any of the other individual active electronic components of the die by internal interconnections. The individual active electronic component not connected by internal interconnections to the other individual active electronic components of the die may be configured to be connected to the other individual active electronic components of the die by external interconnections.

For example, a die may comprise three individual transistors. The first and second transistors may be interconnected by internal interconnections. The third transistor may not be connected to either the first or second transistors by internal interconnections. However, the third transistor may be configured to be, and in fact may be, connected to the first and/or second transistor by external interconnections. It should be appreciated that this is one non-limiting example, and other configurations are also possible.

The various alterations, modifications, and improvements on the various aspects of the invention described herein that will readily occur to those skilled in the art are intended to be part of this disclosure, and are intended to be within the spirit and scope of the aspects of the invention. Accordingly, the foregoing description and drawings are by way of example only.

What is claimed is:

1. A device comprising:
   a die comprising:
      a first individual active electronic element;
      a second individual active electronic element;
   wherein the first individual active electronic element and the second individual active electronic element are not electrically interconnected to another electronic element by interconnections on the die;
   wherein the first individual active electronic element and the second individual active electronic element are configured to be interconnected via external interconnections;
   wherein the die does not include a passive electronic element.

2. The device of claim 1, wherein the first individual active electronic element and the second individual active electronic element are configured to be directly interconnected via external interconnections external to the die.

3. The device of claim 1, wherein the first individual active electronic element and the second individual active electronic element are interconnected to form at least part of a monolithic microwave integrated circuit (MMIC).

4. The device of claim 1, wherein the first individual active electronic element is formed in a gallium nitride material, and the second individual active electronic element is formed in the gallium nitride material.

5. The device of claim 4, wherein the first individual active electronic element and the second individual active electronic element are disposed in an approximately mirror configuration on the die.

6. The device of claim 4, wherein the first individual active electronic element is a transistor.

7. The device of claim 6, wherein the first individual active electronic element is a first field effect transistor (FET).

8. The device of claim 1, further comprising a first passive electronic element formed external to the die and electrically connected to the first individual active electronic element.

9. The device of claim 8, further comprising a second passive electronic element formed external to the die and electrically connected to the second active electronic element.

10. The device of claim 1, further comprising an interconnection, external to the die, interconnecting the first individual active electronic element and the second individual active electronic element.

11. A method of fabricating a device, comprising:
   forming a first individual active electronic element and a second individual active electronic element on a die, the first and second individual active electronic element not interconnected to another electronic element by internal interconnections and the die not including a passive electronic element;
   wherein the first and second individual electronic elements are configured to accept interconnections external to the die.

12. The method of claim 11, wherein forming the first individual active electronic element comprises forming the first individual active electronic element in a gallium nitride material.

13. The method of claim 12, wherein forming the die comprises forming the gallium nitride material on a substrate.

14. The method of claim 11, further comprising interconnecting the first individual active electronic element and the second individual active electronic element via an interconnection external to the die.

15. A method of constructing a monolithic microwave integrated circuit (MMIC), comprising:
   interconnecting, externally to a die, a first individual active electronic element formed in a gallium nitride material on the die and a second individual active electronic element formed in the gallium nitride material on the die to form a MMIC on the die, the MMIC comprising the first individual active electronic element, the second individual active electronic element not interconnected to another electronic component by internal interconnections, and the die not including a passive electronic element.

16. The method of claim 15, wherein the first individual active electronic element is a first transistor and the second individual active electronic element is a second transistor, and wherein interconnecting the first individual active electronic element and the second individual active electronic element comprises connecting a metal between a first contact pad of the first transistor and a second contact pad of the second transistor.

17. The method of claim 16, wherein connecting a metal between the first contact pad of the first transistor and the second contact pad of the second transistor comprises wire-bonding the first contact pad to the second contact pad.

18. The method of claim 16, wherein interconnecting the first individual active electronic element and the second individual active electronic element further comprises coupling a passive electronic element external to the die between the first transistor and the second transistor.

19. The method of claim 16, wherein interconnecting the first individual active electronic element and the second individual active electronic element comprises interconnecting the first transistor and the second transistor in a two-stage configuration.

20. The method of claim 16, wherein the die is encased within a package, and wherein the metal is disposed at least partially external to the package.

\* \* \* \* \*